United States Patent [19]
Liu et al.

[11] Patent Number: 6,001,708
[45] Date of Patent: Dec. 14, 1999

[54] METHOD FOR FABRICATING A SHALLOW TRENCH ISOLATION STRUCTURE USING CHEMICAL-MECHANICAL POLISHING

[75] Inventors: Ming-Tsung Liu, Hsinchu; Tsung-Yuan Hung, Tainan, both of Taiwan

[73] Assignee: United Semiconductor Corp., Hsinchu, Taiwan

[21] Appl. No.: 09/164,288

[22] Filed: Oct. 1, 1998

[30] Foreign Application Priority Data

Jun. 23, 1998 [TW] Taiwan ................................. 87110060

[51] Int. Cl.⁶ .................................................. H01L 21/76
[52] U.S. Cl. ............................................................ 438/435
[58] Field of Search ................................... 438/424, 427, 438/435–37

[56] References Cited

U.S. PATENT DOCUMENTS

| | | | |
|---|---|---|---|
| 4,836,885 | 6/1989 | Breiten et al. | 438/427 |
| 4,876,217 | 10/1989 | Zdebel | 438/437 |
| 5,362,669 | 11/1994 | Boyd et al. | 438/427 |
| 5,702,977 | 12/1997 | Jang et al. | 438/427 |
| 5,710,076 | 1/1998 | Dai et al. | 438/424 |
| 5,817,567 | 10/1998 | Jang et al. | 438/424 |

*Primary Examiner*—Olik Chaudhuri
*Assistant Examiner*—Anh Duy Mai
*Attorney, Agent, or Firm*—Jiawei Huang; J. C. Patents

[57] ABSTRACT

A method for fabricating a STI structure includes a pad oxide layer and a hard masking layer first formed over a semiconductor substrate. A trench is formed in the substrate. A first insulating layer is formed over the substrate. The surface of the first insulating layer within the trench is be between the hard masking layer surface and the semiconductor substrate surface. An insulating cap layer is formed over the first insulating layer with a hardness at least about as large as the hard masking layer. A second insulating layer is formed over the insulating cap layer. A chemical mechanical polishing (CMP) process is performed, using the hard masking layer as a polishing stop, to planarize over the substrate. A process of dipping the substrate into a HF acid solution is performed to remove the hard masking layer and the pad oxide layer, in which the process also simultaneously removes the remaining second insulating layer and the remaining insulating cap layer. The STI structure is accomplished with a significant avoidance of dishing and microscratch.

14 Claims, 3 Drawing Sheets

METHOD FOR FABRICATING A SHALLOW TRENCH ISOLATION STRUCTURE USING CHEMICAL-MECHANICAL POLISHING

CROSS-REFERENCE TO RELATED APPLICATION

This application claims the priority benefit of Taiwan application serial no. 87110060, filed Jun. 23, 1998, the full disclosure of which is incorporated herein by reference.

BACKGROUND OF THE INVENTION

1. Field of the Invention

This invention relates to semiconductor fabrication, and more particularly to a method for fabricating a STI structure to prevent microscratch from occurring on the STI structure during a chemical mechanical polishing (CMP) process.

2. Description of Related Art

The purpose of an isolation structure in an IC device is to prevent carriers, such as electrons or electron-holes, from drifting between two adjacent device elements through a semiconductor substrate to cause a current leakage. For example, carriers drift between two adjacent transistors through their substrate. Conventionally, isolation structures are formed between field effect transistors (FETs) in an IC device, such as a dynamic random access memory (DRAM) device, to prevent a current leakage from occurring. A shallow trench isolation (STI) structure is one of the isolation structures being widely used.

FIGS. 1A–1D are cross-sectional views of a semiconductor device schematically illustrating a conventional fabrication process for forming a shallow trench isolation structure. In FIG. 1A, a pad oxide layer 102 and a silicon nitride layer 104 are sequentially formed over a semiconductor substrate 100. In FIG. 1B, a trench 106 is formed in the substrate 100 by patterning over the substrate 100 through, for example, photolithography and etching. The silicon nitride layer 104 and the pad oxide layer 102 are etched through and become a silicon nitride layer 104a and a pad oxide layer 102a. Then, a liner oxide layer 108 is formed over the side-wall of the trench 106.

In FIG. 1C and FIG. 1D, an oxide layer 110 is formed over the substrate 100 so that the trench 106 shown in FIG. 1B is filled with oxide. A CMP process is, for example, performed to polish the oxide layer 110, in which the silicon nitride layer 104a is used as a polishing stop so that it is exposed. Then, the silicon nitride layer 104a is removed by, for example, dipping it in a HF acid solution. A residual of the oxide layer 110 fills the trench 106 becoming a STI oxide 110a.

The CMP process is one of planarization technologies by making use of slurry, which is a chemical reagent, to chemically and mechanically polish the uneven surface of a deposited oxide layer so as to achieve a planarization purpose. Slurry contains a huge number of fine grinding particles with a dimension of about 0.1–0.2 microns. The grinding particles compose a good abrasive. A rotating holder holds the wafer on the backside. The front surface is pushed onto a polishing pad, which is held by a rotating polishing table. Slurry is provided on the contact surface between the polishing pad and the front surface of the wafer. Since they are rotated, the polishing purpose is achieved. The ingredient of slurry is different for a different material to be polished.

During the CMP process, the fine grinding particles may cause a microscratch on a soft material. For example, in a method for fabricating a STI structure as described above, the oxide layer 110 is usually formed by atmospheric pressure (AP) chemical vapor deposition (CVD) (APCVD). In FIG. 1C, the oxide layer 110 is thereby soft. As the CMP process is performed to form the STI oxide 110a, in order to totally remove the oxide layer 110 above the silicon nitride layer 104a, the silicon nitride layer 104a is strategically over-polished. Since the hardness of silicon nitride is higher than oxide, oxide is polished away with a higher rate to cause a dishing top surface of the STI oxide 110a. More severely, since the process to remove the silicon nitride layer 104a also affect the oxide layer 110, the dishing phenomenon is aggravated to deteriorate the performance of device.

Moreover, during the over-polishing stage, the CMP process polishes silicon nitride to produce silicon nitride particles, which are mixed with slurry and cause a damage on the STI oxide 110a, such as a microscratch 112. Even though the microscratch phenomenon is not observable by eye, if it is not fixed, it may cause an occurrence of a bridge between polysilicon gates formed subsequently or an occurrence of pattern distortion, in which the bridge may induce current leakage. The microscratch phenomenon then results in a failure of device. The yield rate is decreased.

SUMMARY OF THE INVENTION

It is therefore an objective of the present invention to provide a method for fabricating a STI structure that avoids a dishing phenomenon often due to an over-polishing process.

It is another an objective of the present invention to provide a method for fabricating a STI structure that avoids an aggravation of dishing often occurring while removing a hard masking layer, which is used for pattering a trench for the STI structure.

It is still another an objective of the present invention to provide a method for fabricating a STI structure with a prevention of microscratch resulting from performing a CMP process on it.

In accordance with the foregoing and other objectives of the present invention, a method is provided for fabricating a STI structure having a pad oxide layer and a hard masking layer that are sequentially formed over a semiconductor substrate. In accordance with the method, a trench is formed in the substrate by patterning the pad oxide layer, the hard masking layer, and the substrate. Then, a first insulating layer is formed over the substrate. The surface of the first insulating layer within the trench is necessary to be between the upper surface of the hard masking layer and the upper surface of the semiconductor substrate. An insulating cap layer is formed over the first insulating layer with a hardness at least about as large as the hard masking layer or larger. A second insulating layer is formed over the insulating cap layer. A chemical mechanical polishing (CMP) process is performed, using the hard masking layer as a polishing stop, to polish and planarize over the substrate. After the CMP process, a portion of the second insulating layer, a portion of the insulating cap layer, and a portion of the first insulating layer other than the trench are removed to expose the hard masking layer. The remaining portion of the insulating cap layer and the remaining portion of the second insulating layer within the trench are also exposed. A process of dipping the substrate into a HF acid solution is performed to remove the hard masking layer and the pad oxide layer, in which the process also simultaneously removes the remaining second insulating layer and the remaining insulating cap layer. The STI structure is then accomplished with a significant avoidance of dishing and microscratch.

The insulating cap layer preferably includes silicon nitride and is formed by low pressure chemical vapor deposition (LPCVD) or plasma enhanced chemical vapor deposition (PECVD). The second insulating layer preferably includes oxide and is formed by LPCVD or PECVD.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1A:
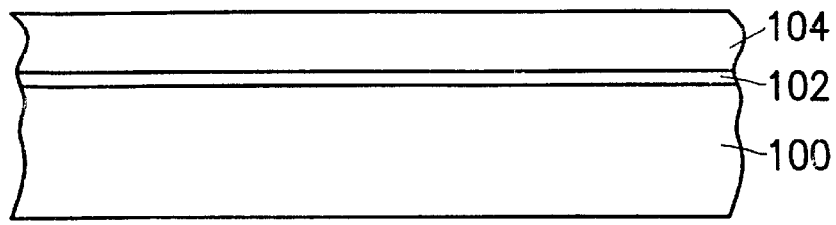
FIGS. 1A–1D are cross-sectional views of a semiconductor device schematically illustrating a conventional fabrication process for forming a shallow trench isolation structure.
Figure 1B:
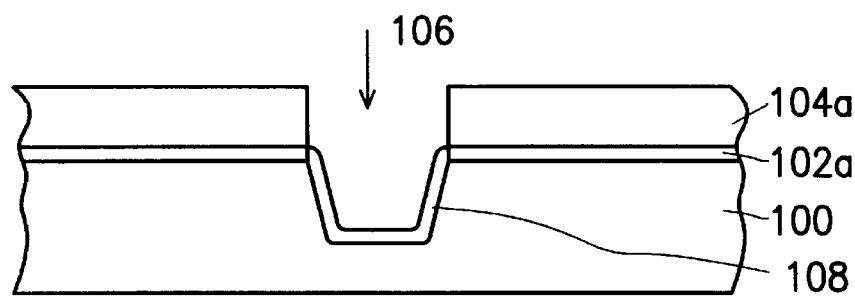
Figure 1C:
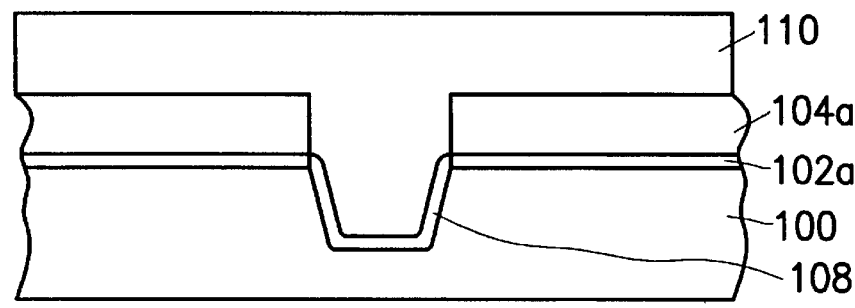
Figure 1D:
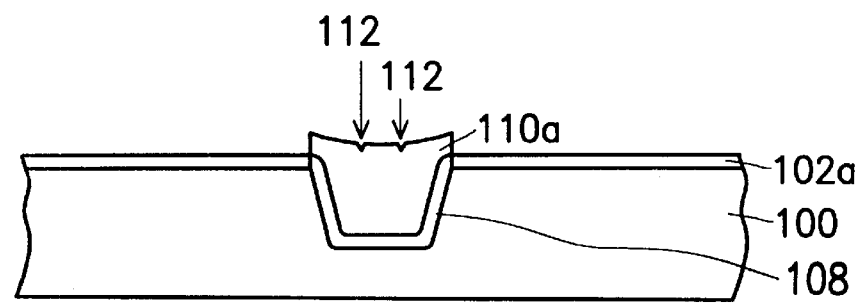

In order to avoid subsequent fabrication problems caused by the microscratch and dishing phenomena on a STI structure, the invention provides a method for fabricating a STI structure to effectively reduce the occurrence of dishing and microscratch. After trench is formed in a semiconductor substrate, as show in FIG. 1B, in accordance with the method of the invention, an insulating layer is formed over the substrate to fill the trench. One advantage of the invention is that the height of the insulating layer within the trench is controlled to be between the height of the semiconductor substrate and the height of a hard masking layer of the trench. Hence, when an insulating layer cap layer is subsequently formed over the insulating layer, its height within the trench also lower than the height of the hard masking layer to protect the insulating layer within the trench, on which the STI structure is to be formed.

Figure 2A:
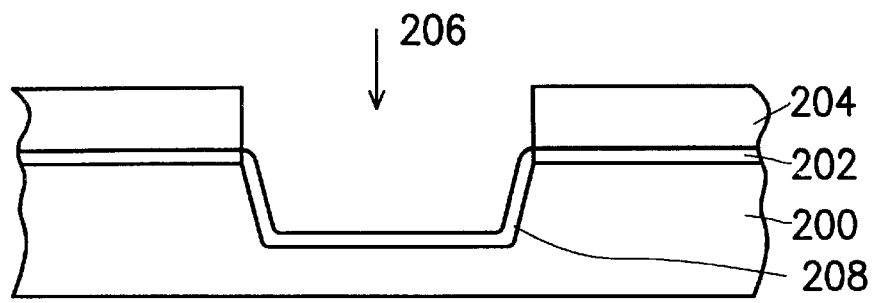
FIGS. 2A–2E are cross-sectional views of a semiconductor device schematically illustrating a fabrication process for forming a shallow trench isolation structure, according to a preferred embodiment of the invention.

FIGS. 2A–2E are cross-sectional views of a semiconductor device schematically illustrating a fabrication process for forming a shallow trench isolation (STI) structure, according to a preferred embodiment of the invention. In FIG. 2A, a pad oxide layer 202 and a hard masking layer 204 are sequentially formed over a semiconductor substrate 200. A trench 206 is formed in the substrate 206 by, for example, photolithography and etching, in which the hard masking layer 204 and the pad oxide layer 202 are etched through, and the semiconductor substrate 200 is partially etched without etching through. The region covered by the hard masking layer 204 is an active area, where a transistor, for example, is to be subsequently formed. The hard masking layer includes, for example, silicon nitride. Then a liner oxide layer 208 may preferably be formed over the side-wall of the trench 206 in the semiconductor substrate 200 because the liner oxide layer 208 can provide a better adhesion for the material to be subsequently formed over.

Figure 2B:
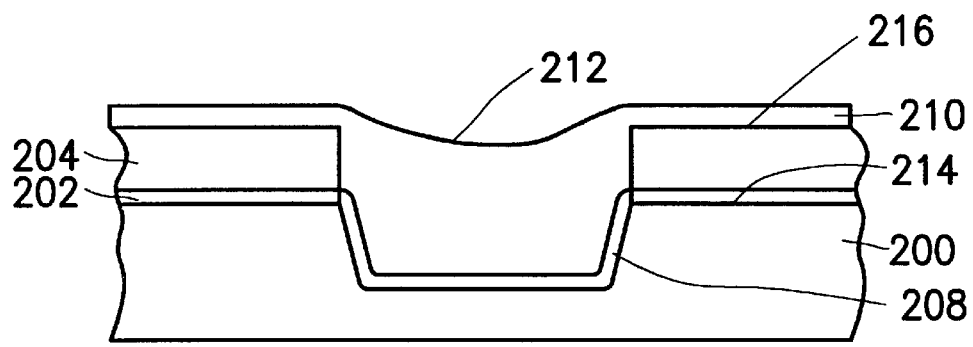

In FIG. 2B, an insulating layer 210 including, for example, oxide is formed over the substrate 200 by, for example, atmospheric pressure chemical vapor deposition (APCVD) or low pressure chemical vapor deposition (LPCVD). The insulating layer 210 has a trench surface 212 within the trench 206. The height of the trench surface 212 is controlled to be between the height of a masking layer surface 216 and the height of a semiconductor substrate surface 214. This makes a protection over the STI structure be possible, as is to be described below.

Figure 2C:
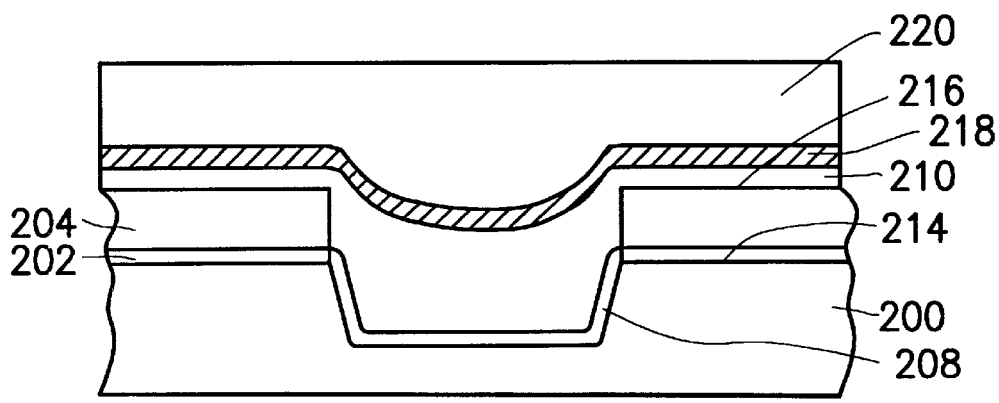

In FIG. 2C, an insulating cap layer 218 is formed over the substrate 200, at least about as hard as the hard masking layer 204 or harder. The insulating layer cap layer 218 is formed by, for example, LPCVD or plasma enhanced CVD (PECVD) to deposit silicon nitride over the substrate 200 with a thickness of about 500 Å–1000 Å. Next, an insulating layer 220 including, for example, oxide is formed over the substrate 200 by, for example, PECVD or LPCVD with a thickness of about 5000 Å. Since the trench surface 212 shown in FIG. 2B is lower than the hard masking layer surface 216, the lower surface of the insulating cap layer within the trench 206 of FIG. 2A is below the hard masking layer surface 216.

Figure 2D:
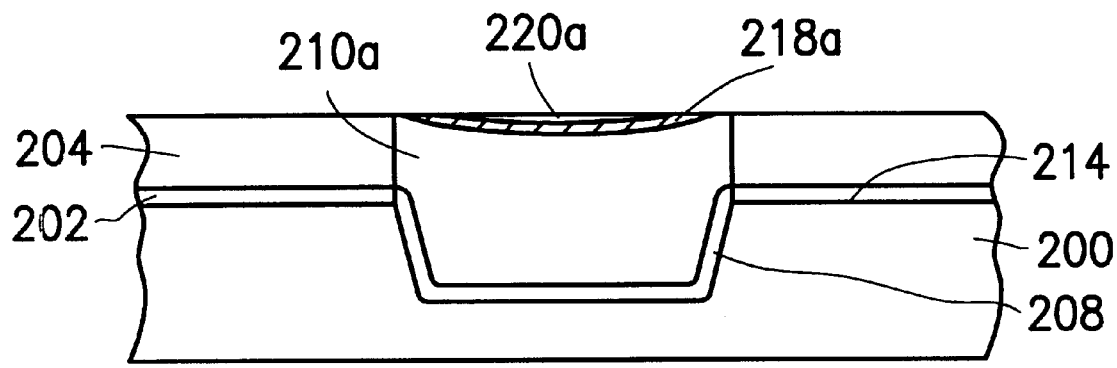

In FIG. 2D, using the hard masking layer 204 as a polish stop, a chemical mechanical polishing (CMP) process is performed to polish and planarize over the substrate 200 until the hard masking layer 204 is exposed. Also referring to FIG. 2C, a remaining portion of the insulation layer 220, a remaining portion of the insulating layer 218, and a remaining portion of the insulating layer 210 inside the trench 206 shown in FIG. 2A respectively become an insulating layer 220a, an insulating cap layer 218a, and an insulating layer 210a. During the CMP process, the insulating cap layer 218a and the insulating layer 220a can protect the insulating layer 210a from the CMP process, which may cause microscratch on the insulating layer 210a. Almost no dishing phenomenon occurring during the CMP process because the insulating cap layer 218a is at least as hard as the hard masking layer 204. Here the insulating layer 220a is not absolutely necessary if the upper surface height of insulating cap layer 218a is greater than the height of the hard masking layer 204.

Figure 2E:
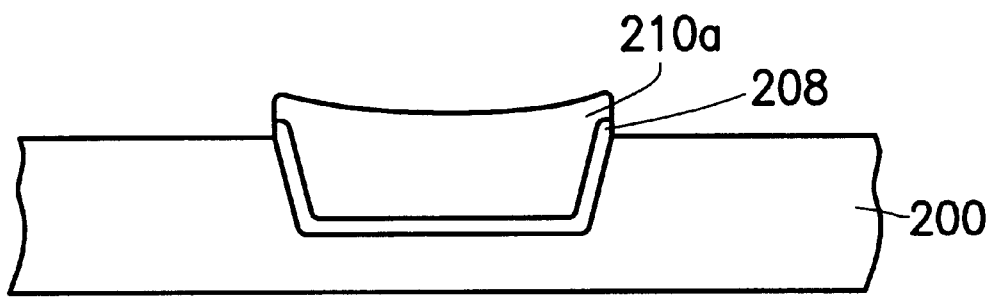

Next, in FIG. 2E, the hard masking layer 204 and the pad oxide layer 202 are removed by, for example dipping the substrate 200 into a HF acid solution. During this process, the insulating layer 220a and the insulating cap layer 218a are simultaneously removed. Again, the insulating cap layer 218a protects the insulating layer 210a from the HF acid etching so that the dishing problem is not aggravated. The STI structure of the invention then includes the insulating layer 210a and may preferably include the liner oxide layer 208 to increase a better adhesion for the material to be subsequently formed over.

In conclusion, the characteristics of the invention is following:

1. The trench surface 212 of the insulating layer 210 is controlled to be between the semiconductor substrate surface 214 and the hard masking layer surface 216. This allows the insulating cap layer 218 also has the lower surface within the trench 206 below the hard masking layer surface 216. Therefore, the insulating cap layer 218 can prevent microscratch and dishing from occurring on the insulating layer 210a during the CMP process.

2. During removing the hard masking layer 214 and the pad oxide layer 202, even though the insulating cap layer 218a is also removed, it avoids the aggravation of dishing on the insulating layer 210a, which is the main part of the STI structure.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a shallow trench isolation (STI) structure on a semiconductor substrate, having a pad oxide layer and a masking layer sequentially formed over the substrate, and having a trench formed in the substrate through the pad oxide layer and the masking layer, the masking layer having a masking surface on its top, the semiconductor substrate having a substrate surface on its top before the pad oxide layer is formed, the method comprising:

forming a first insulating layer over the substrate to fill the trench, wherein the portion of the first insulating layer filled inside the trench has a trench surface between the substrate surface and the masking layer surface;

forming an insulating cap layer over the first insulating layer, wherein the insulating cap layer is at least about as hard as the masking layer or harder;

forming a second insulating layer over the insulting cap layer;

performing a chemical mechanical polishing (CMP) process, using the masking layer as a polishing stop, to polish and planarize over the substrate until the masking layer is exposed, wherein there is a remaining portion of the insulating cap layer within the trench; and removing the remaining portion of the insulating cap layer, the masking layer, and the pad oxide layer.

2. The method of claim 1, wherein in the step of performing the CMP process to polish over the substrate, there is also a remaining portion of the second insulating layer within the trench.

3. The method of claim 2, wherein the step of removing the remaining portion of the insulating cap layer and so on also comprises removing the remaining portion of the second insulating layer.

4. The method of claim 3, wherein the step of removing the remaining portion of the insulating cap layer and so on comprises a HF acid solution.

5. The method of claim 1, wherein before the step of forming the first insulating layer over the substrate, the method further comprises forming a liner oxide layer over the side-wall of the trench in the semiconductor substrate.

6. The method of claim 1, wherein the insulating cap layer comprises silicon nitride.

7. The method of claim 1, wherein the first insulating layer comprises oxide.

8. The method of claim 1, wherein the step of forming the first insulating layer comprises low pressure chemical vapor deposition (LPCVD) or atmospheric pressure chemical vapor deposition (APCVD).

9. The method of claim 1, wherein the step of forming the insulating cap layer comprises LPCVD or plasma enhanced chemical vapor deposition (PECVD).

10. The method of claim 1, wherein the insulating cap layer has a thickness of about 500 Å–1000 Å.

11. The method of claim 1, wherein the step of forming the second insulating layer comprises low pressure chemical vapor deposition (LPCVD) or plasma enhanced chemical vapor deposition (PECVD).

12. The method of claim 1, wherein the second insulating layer comprises oxide.

13. The method of claim 1, wherein the step of removing the remaining portion of the insulating cap layer and so on comprises a HF acid solution.

14. The method of claim 1, wherein the second insulating layer has a thickness of about 5000 Å.

* * * * *